(12) United States Patent
Omori et al.

(10) Patent No.: US 11,745,303 B2
(45) Date of Patent: Sep. 5, 2023

(54) POLISHING BODY AND MANUFACTURING METHOD THEREFOR

(71) Applicant: NORITAKE CO., LIMITED, Nagoya (JP)

(72) Inventors: Wataru Omori, Nagoya (JP); Takaya Yamaguchi, Nagoya (JP); Shota Kitajima, Nagoya (JP); Makoto Sato, Nagoya (JP)

(73) Assignee: NORITAKE CO., LIMITED, Nagoya (JP)

( * ) Notice: Subject to any disclaimer, the term of this patent is extended or adjusted under 35 U.S.C. 154(b) by 1154 days.

(21) Appl. No.: 16/317,092

(22) PCT Filed: Jul. 10, 2017

(86) PCT No.: PCT/JP2017/025178
§ 371 (c)(1),
(2) Date: Jan. 11, 2019

(87) PCT Pub. No.: WO2018/012468
PCT Pub. Date: Jan. 18, 2018

(65) Prior Publication Data
US 2019/0247975 A1    Aug. 15, 2019

(30) Foreign Application Priority Data

Jul. 12, 2016  (JP) ................................ 2016-138049

(51) Int. Cl.
*B24B 37/26*      (2012.01)
*H01L 21/321*    (2006.01)
(Continued)

(52) U.S. Cl.
CPC .............. *B24B 37/26* (2013.01); *B24B 37/24* (2013.01); *B24D 3/00* (2013.01); *B24D 3/32* (2013.01);
(Continued)

(58) Field of Classification Search
None
See application file for complete search history.

(56) References Cited

U.S. PATENT DOCUMENTS 6,641,471 B1    11/2003  Pinheiro et al.
8,568,499 B2 *  10/2013  Nagata ..................... B24D 3/18
                                                                    51/293
(Continued)

FOREIGN PATENT DOCUMENTS

CN      104603877 A      5/2015
EP      2123400 A1 *   11/2009  ............. B24B 37/24
(Continued)

OTHER PUBLICATIONS

Machine Generated English Translation of JP201112809 Published Oct. 27, 2011.(Year: 2011).*

(Continued)

*Primary Examiner* — Sylvia MacArthur
(74) *Attorney, Agent, or Firm* — Oliff PLC (57) ABSTRACT

In an abrasive body used for polishing by a CMP method, provided with a resin structure, a plurality of abrasive grains, and a plurality of longitudinal pores, and made in a form of disc, the longitudinal pore has a length in a thickness direction of the abrasive body longer than a length in a planar direction of the abrasive body, the resin structure includes communicating pores each of which communicating with the longitudinal pore and/or communicating with other communicating pore, the communicating pores include at least one of the abrasive grains in the pores respectively, and the average diameter of the communicating pores is not more than 18 times larger than the average diameter of the abrasive grains.

8 Claims, 7 Drawing Sheets

(51) Int. Cl.
  *B24D 3/00*    (2006.01)
  *B24D 11/00*   (2006.01)
  *B24D 3/32*    (2006.01)
  *B24B 37/24*   (2012.01)
  *H01L 21/304*  (2006.01)
(52) U.S. Cl.
  CPC ............ *B24D 11/00* (2013.01); *H01L 21/304* (2013.01); *H01L 21/3212* (2013.01)

(56) References Cited

U.S. PATENT DOCUMENTS

| | | | |
|---|---|---|---|
| 9,056,382 B2* | 6/2015 | Litke | C08G 18/222 |
| 2002/0058469 A1 | 5/2002 | Pinheiro et al. | |
| 2005/0042976 A1* | 2/2005 | Ronay | B24B 37/24 |
| | | | 451/41 |
| 2005/0150172 A1 | 7/2005 | Sato | |
| 2010/0087128 A1* | 4/2010 | Nakayama | B24B 37/24 |
| | | | 451/548 |
| 2011/0135906 A1* | 6/2011 | Nagata | B24D 5/10 |
| | | | 428/305.5 |
| 2016/0176022 A1 | 6/2016 | Qian et al. | |
| 2017/0100815 A1* | 4/2017 | Sato | C08L 81/06 |
| 2019/0247975 A1* | 8/2019 | Omori | H01L 21/304 |

FOREIGN PATENT DOCUMENTS

| | | |
|---|---|---|
| JP | 2002-075934 A | 3/2002 |
| JP | 2002-144220 A | 5/2002 |
| JP | 2008-068390 A | 3/2008 |
| JP | 4266579 B2 | 5/2009 |
| JP | 2010-228009 A | 10/2010 |
| JP | 2011-049256 A | 3/2011 |
| JP | 2011-067923 A | 4/2011 |
| JP | 2011-212809 A | 10/2011 |
| JP | 2011212809 A * | 10/2011 |
| JP | 2012130992 A * | 7/2012 |
| JP | 5511266 B2 | 6/2014 |
| JP | 2016-117152 A | 6/2016 |
| WO | 2014/045653 A1 | 3/2014 |

OTHER PUBLICATIONS

Machine Generated English Translation of JP2012130992 Oublished Jul. 12, 2012. (Year: 2012).*
Sep. 26, 2017 International Search Report issued in International Patent Application No. PCT/JP2017/025178.
Jul. 15, 2021 Office Action issued in Korean Patent Application No. 10-2019-7003786.
Feb. 17, 2021 Office Action issued in Taiwanese Patent Application No. 106123191.
Jul. 27, 2020 Office Action issued in Chinese Patent Application No. 201780043156.X.
Sep. 3, 2019 Office Action issued in Japanese Patent Application No. 2018-527600.

* cited by examiner

| | AVERAGE DIAMETER OF COMMUNICATING PORES/ AVERAGE DIAMETER OF ABRASIVE GRAINS | FIRST EFFICIENCY OF POLISHING (mm/h) | SECOND EFFICIENCY OF POLISHING (mm/h) | THIRD EFFICIENCY OF POLISHING (mm/h) |
|---|---|---|---|---|
| EXAMPLE PRODUCT 1 | 1.7 | 627 | 717 | 571 |
| EXAMPLE PRODUCT 2 | 3.7 | 528 | 450 | 503 |
| EXAMPLE PRODUCT 3 | 12.3 | 382 | 431 | 357 |
| EXAMPLE PRODUCT 4 | 15.9 | 465 | 391 | 410 |
| COMPARATIVE EXAMPLE PRODUCT 1 | 18.9 | 472 | 202 | 124 |

FIG.9

| | AVERAGE DIAMETER OF COMMUNICATING PORES/AVERAGE DIAMETER OF ABRASIVE GRAINS | DENSITY OF LONGITUDINAL PORES (PORES/SQUARE mm) | | | | | | | ROTATION OF WORKPIECE (rpm) | GBIR (μm) |
|---|---|---|---|---|---|---|---|---|---|---|
| | | ≧50 μm | ≧100 μm | ≧120 μm | ≧140 μm | ≧150 μm | ≧180 μm | ≧200 μm | | |
| EXAMPLE PRODUCT 5 | 3.2 | 17 | 13 | 9 | 6 | 5 | 1 | 0 | 27 | 5.8 |
| EXAMPLE PRODUCT 6 | 3.4 | 16 | 13 | 10 | 8 | 6 | 2 | 1 | 23 | 5.8 |
| EXAMPLE PRODUCT 7 | 4.6 | 11 | 10 | 9 | 8 | 7 | 5 | 3 | 30 | 5.5 |
| EXAMPLE PRODUCT 8 | 5.1 | 7 | 7 | 6 | 5 | 5 | 4 | 3 | 37 | 5.7 |
| EXAMPLE PRODUCT 9 | 3.1 | 20 | 12 | 8 | 5 | 3 | 0 | 0 | 16 | 7.4 |
| COMPARATIVE EXAMPLE PRODUCT 2 | 1.9 | 0 | 0 | 0 | 0 | 0 | 0 | 0 | 0 | 9.7 |

POLISHING BODY AND MANUFACTURING METHOD THEREFOR

TECHNICAL FIELD

The present invention relates to an abrasive body suitably used for chamfering a semiconductor wafer or for polishing a surface of the semiconductor by a Chemical Mechanical Polishing (CMP) method and a method of manufacturing the same.

BACKGROUND ART

A known abrasive body used for polishing by the CMP method is provided with a resin structure and a plurality of abrasive grains and is made in a form of disc with a plurality of communicating pores such that the abrasive grains are contained in the pores. For example, this corresponds to an abrasive body described in Patent Documents 1 and 2.

PRIOR ART DOCUMENT

Patent Document
Patent Document 1: Japanese Patent No. 4266579
Patent Document 2: Japanese Patent No. 5511266

SUMMARY OF THE INVENTION

Problem to Be Solved by the Invention

The abrasive body described in Patent Documents 1 and 2 is made of a flow material obtained by dissolving a resin for a resin structure in a solvent and mixing a plurality of abrasive grains therewith and formed into a disc shape, and the abrasive bodies have abrasive grains contained in a plurality of pores or minute foam formed in the resin structure. As a result, since the abrasive grains are easily released from the resin structure during polishing in which a workpiece is pressed against the abrasive body for polishing, and free abrasive grains are supplied by the abrasive body itself between the abrasive body and the workpiece, sufficient polishing performance can be achieved without using costly slurry, for example. Furthermore, in Patent Document 2, water-soluble particles are mixed into solvent together with the resin for the resin structure and the abrasive grains so that large pores larger in diameter than the communicating pores in the resin structure are formed in the abrasive body. By forming the large pores, a sliding resistance generated between the abrasive body and the workpiece can be reduced during polishing, and therefore, sufficient polishing performance can be achieved without using slurry, and the workpiece can uniformly be polished.

However, in the technique of Patent Document 1, when the diameter of the pores is sufficiently reduced such that the abrasive grains can stably be contained, a negative pressure generated between the abrasive body and the workpiece increases, which makes the sliding resistance larger. As a result, a polishing apparatus using the abrasive body may not operate smoothly or may vibrate, so that a workpiece having a large polishing area may not uniformly be polished, for example. In the technique of Patent Document 2, the sliding resistance generated between the abrasive body and the workpiece can be reduced since the large pores are formed in the abrasive body; however, when the abrasive body is formed, for example, a low amount of the water-soluble particles for forming the large pores may make it unable to reduce the sliding resistance, and a high amount of the water-soluble particles may tend to cause scratches on the workpiece.

The present invention was conceived in view of the situations and it is therefore an object of the present invention to provide an abrasive body (LHA pad) that is used for polishing by the CMP method and that achieves stable polishing performance and uniform polishing of a workpiece, and a method of manufacturing the same.

As a result of continuing intensive studies for developing such an abrasive body and a method of manufacturing the same, the present inventor found that the stabilization of the polishing performance by retaining abrasive grains without excess or deficiency and the reduction in sliding resistance generated between the abrasive body and a workpiece are affected by a relationship between an average diameter of the pores formed in the resin structure and an average diameter of the abrasive grains contained in the pores, and the presence of longitudinal pores formed to extend in a thickness direction in the abrasive body. The present invention was conceived based on this idea.

Solution to Problem

To achieve the above object, a first aspect of the present invention provides an abrasive body (a) used for polishing by a CMP method, provided with a resin structure, a plurality of abrasive grains, and a plurality of longitudinal pores, and made in a form of disc, wherein the longitudinal pore has a length in a thickness direction of the abrasive body longer than a length in a planar direction of the abrasive body, wherein (b) the resin structure includes communicating pores each of which communicating with the longitudinal pore and/or communicating with other communicating pore, wherein (c) the communicating pores include at least one of the abrasive grains in the pores respectively, and wherein (d) the average diameter of the communicating pores is not more than 18 times larger than the average diameter of the abrasive grains.

A second aspect of the present invention provides the abrasive body according to the first aspect of the invention, wherein the longitudinal pore has opening on a polishing surface side of the abrasive body.

A third aspect of the present invention provides the abrasive body according to the first or second aspect of the invention, wherein the opening of the longitudinal pore has an opening diameter of 50 (μm) or more.

A fourth aspect of the present invention provides the abrasive body according to the third aspect of the invention, wherein the abrasive body is provided with the seven or more longitudinal pores of 50 (μm) or more in the opening diameter per square millimeter on the polishing surface.

A fifth aspect of the present invention provides the abrasive body according to the third or fourth aspect of the invention, wherein the longitudinal pore has the opening diameter of 180 (μm) or more.

A sixth aspect of the present invention provides the abrasive body according to the fifth aspect of the invention, wherein the abrasive body is provided with the one or more longitudinal pores of 180 (μm) or more in the opening diameter D per square millimeter on the polishing surface.

A seventh aspect of the present invention provides the abrasive body according to any one of the first to sixth aspects of the invention, wherein the resin structure contains a polysulfone-based resin.

An eighth aspect of the present invention provides the abrasive body according to any one of the first to seventh aspects of the invention, wherein the average diameter of the abrasive grains ranges from 0.005 (μm) to 3.0 (μm).

A ninth aspect of the present invention provides the abrasive body according to any one of the first to eighth aspects of the invention, wherein the abrasive grains contain silica.

A tenth aspect of the present invention provides a method of manufacturing the abrasive body (a) used in polishing by a CMP method, provided with a resin structure, a plurality of abrasive grains, and a plurality of longitudinal pores, and made in a form of disc, the longitudinal pore has a length in a thickness direction of the abrasive body longer than a length in a planar direction of the abrasive body, the method of manufacturing the abrasive body according to any one of claims 1 to 9 comprising: (b) a dissolving/mixing step of dissolving a resin for the resin structure in a solvent mixed with the abrasive grains to prepare a flow material; (c) a casting step of casting the flow material into a sheet shape having a predetermined thickness; (d) a desolventizing step of immersing the sheet-shaped cast body cast in the casting step in a nonsolvent to remove the solvent form the cast body until the resin structure is cured; and (e) a drying step of drying the cast body having subjected to the desolventizing step.

Advantageous Effects of Invention

The abrasive body recited in the first aspect of the invention is provided with the resin structure, the plurality of the abrasive grains, and the plurality of the longitudinal pores and made in a form of disk; the resin structure includes the communicating pores each of which communicating with the longitudinal pores and/or communicating with other communicating pore; the communicating pores include at least one of the abrasive grains respectively; and the average diameter of the communicating pores is not more than 18 times larger than the average diameter of the abrasive grains. Therefore, during the polishing in which a workpiece is pressed against the abrasive body for the polishing, the abrasive body can stably retain the abrasive grains in the pores without excessively releasing the abrasive grains contained in the pores and therefore can achieve stable polishing performance. Additionally, the abrasive body is provided with the longitudinal pores and therefore can reduce the sliding resistance due to the negative pressure generated between the abrasive body and the workpiece during the polishing, so that the workpiece can uniformly be polished.

According to the abrasive body recited in the second aspect of the invention, the longitudinal pore has opening on the polishing surface side of the abrasive body. As a result, the sliding resistance due to the negative pressure generated between the abrasive body and the workpiece can further be reduced, so that the workpiece can more uniformly be polished.

According to the abrasive body recited in the third aspect of the invention, the opening of the longitudinal pore is formed such that the opening diameter of the longitudinal pore is not less than 50 (µm). As a result, the sliding resistance due to the negative pressure generated between the abrasive body and the workpiece can further be reduced, so that the workpiece can more uniformly be polished.

According to the fourth aspect of the invention, the abrasive body is provided with the seven or more longitudinal pores of 50 (µm) or more in the opening diameter per square millimeter on the polishing surface. As a result, the sliding resistance due to the negative pressure generated between the abrasive body and the workpiece can further be reduced, so that the workpiece can more uniformly be polished.

According to the fifth aspect of the invention, the abrasive body is formed such that the dimension of the opening diameter of the longitudinal pore is 180 (µm) or more. As a result, the sliding resistance due to the negative pressure generated between the abrasive body and the workpiece can further be reduced, so that the workpiece can more uniformly be polished.

According to the sixth aspect of the invention, the abrasive body is provided with the one or more longitudinal pores of 180 (µm) or more in the opening diameter per square millimeter on the polishing surface. As a result, the sliding resistance due to the negative pressure generated between the abrasive body and the workpiece can further be reduced, so that the workpiece can more uniformly be polished.

According to the abrasive body recited in the seventh aspect of the invention, the resin structure contains a polysulfone-based resin. As a result, the practical abrasive body can be provided by using the resin structure excellent in material strength.

According to the abrasive body recited in the eighth aspect of the invention, the average diameter of the abrasive grains ranges from 0.005 (µm) to 3.0 (µm). As a result, polishing scratches can be prevented from occurring on the workpiece due to the abrasive grains released from the resin structure when polishing to the workpiece is performed, so that the polishing can be performed with high accuracy.

According to the abrasive body recited in the ninth aspect of the invention, the abrasive grains contain silica. As a result, the practical abrasive body can be provided by using the abrasive grains suitable for a workpiece.

According to the tenth aspect of the invention, the abrasive body recited in any one of the first to ninth aspects of the invention is provided by the manufacturing method including the dissolving/mixing step of dissolving the resin for the resin structure in the solvent mixed with the abrasive grains to prepare a flow material, the casting step of casting the flow material into a sheet shape having a predetermined thickness, the desolventizing step of immersing the sheet-shaped cast body cast in the casting step in a nonsolvent to remove the solvent from the sheet-shaped cast body until the resin structure is cured, and the drying step of drying the cast body having subjected to the desolventizing step. During the polishing in which the workpiece is pressed against the abrasive body for polishing, the abrasive body manufactured in this way can stably retain the abrasive grains in the pores without excessively releasing the abrasive grains contained in the pores and therefore can achieve stable polishing performance. Additionally, the abrasive body is provided with the longitudinal pores and therefore can reduce the sliding resistance due to the negative pressure generated between the abrasive body and the workpiece. Therefore, since the abrasive grains can stably be retained in the pores, stable polishing performance can be achieved, and the sliding resistance between the abrasive body and the workpiece can be reduced, so that the abrasive body capable of uniformly polishing the workpiece can be manufactured.

Preferably, the average diameter of the pores is not more than 16 times larger than the average diameter of the abrasive grains. As a result, during the polishing in which the workpiece is pressed against the abrasive body for polishing, the abrasive grains contained in the pores can stably be contained in the pores without excessive release, so that more stable polishing performance can be achieved. Furthermore, since the abrasive body has the longitudinal pores, the sliding resistance due to the negative pressure generated between the abrasive body and the workpiece can be reduced, so that the workpiece can more uniformly be polished.

Preferably, the average diameter of the abrasive grains is 0.005 to 1.0 (μm), more preferably 0.02 to 0.6 (μm), and more preferably 0.08 to 0.5 (μm), and further preferably 0.08 to 0.3 (μm). As a result, polishing scratches can be prevented on the workpiece due to the abrasive grains released from the resin structure when polishing is performed, so that polishing can be performed with higher accuracy.

MODES FOR CARRYING OUT THE INVENTION

An example of the present invention will be described in detail with reference to the drawings. In the following example, the figures are simplified or deformed as appropriate and portions are not necessarily precisely drawn in terms of dimension ratio, shape, etc.

EXAMPLE

Figure 1:
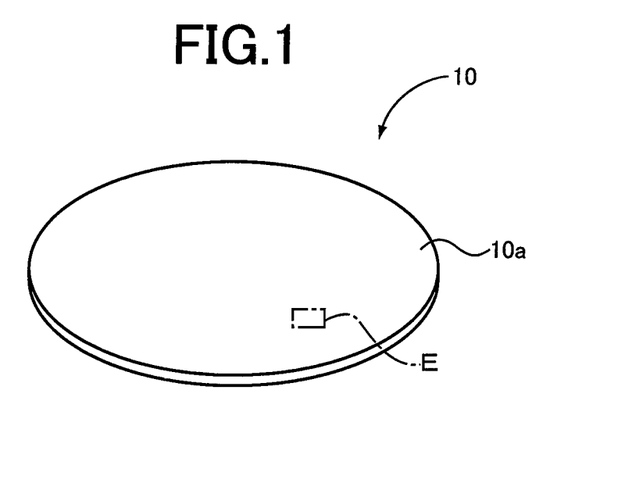
FIG. 1 is a perspective view showing a sheet-shaped abrasive body used for polishing by the CMP method according to an example of the present invention.

FIG. 1 is a perspective view showing an abrasive body 10 according to an example of the present invention. The abrasive body 10 of this example is provided with a resin structure 12 and a plurality of abrasive grains 14 in a form of disc and has the dimensions, for example, of approximately 1000 (mmφ) in outer diameter and approximately 2 (mm) in thickness. The abrasive body 10 is affixed to a polishing table 20 of a polishing apparatus 19 as described below and mostly used for polishing in the CMP (Chemical Mechanical Polishing) method.

The resin structure 12 is made of, for example, polysulfone-based resin or may contain other resins, for example, at least one of polyamide, polyamidimide, polyimide, polyacrylonitrile, polyvinylidene fluoride, cellulose acetate, polyvinyl alcohol, and polyurethane.

The abrasive grains 14 are preferably made of silica or may include other abrasive grains, for example, at least one of ceria, alumina, zirconia, titania, manganese oxide, barium carbonate, chromium oxide, and iron oxide. As silicon oxide, for example, fumed silica (fine particles of silicon oxide produced from such as silicon tetrachloride or chlorosilane burnt at high temperature under the presence of hydrogen and oxygen) is preferably used. An average diameter of the abrasive grains 14 is preferably 0.005 to 3.0 (μm), more preferably 0.005 to 1.0 (μm), more preferably 0.02 to 0.6 (μm), more preferably 0.08 to 0.5 (μm), and further preferably 0.08 to 0.3 (μm). For example, when the average diameter of the abrasive grains 14 exceeds 3.0 (μm), polishing scratches are likely to occur on a workpiece due to the abrasive grains 14 released from the resin structure 12 in polishing described later. Furthermore, when the average diameter of the abrasive grains 14 is less than 0.005 (μm), the abrasive grains 14 are likely to agglomerate and polishing scratches are likely to occur on a workpiece in the polishing. The diameter of the abrasive grains 14 was measured by a laser diffraction/scattering method, for example, with a particle diameter/particle size distribution measuring apparatus, Microtrac MT3300, manufactured by Nikkiso Co., Ltd., and the average diameter is the arithmetic mean of diameter. The diameter less than a measurement limit of the laser diffraction/scattering method is measured by a dynamic light scattering method by using, for example, a particle diameter/particle size distribution measuring apparatus, Nanotrac UPA-EX250, manufactured by Nikkiso Co., Ltd.

Figure 2:
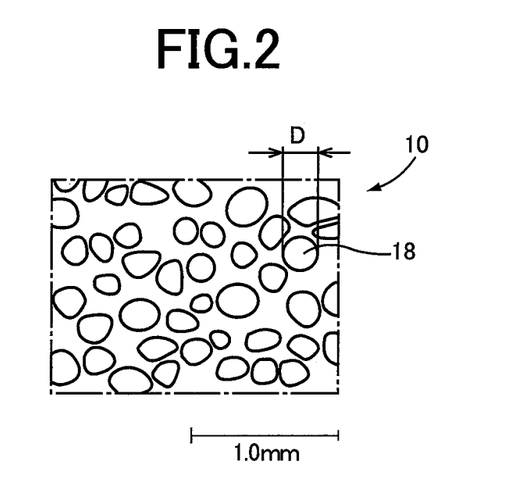
FIG. 2 is a view showing a portion of a cross section of the abrasive body of FIG. 1, which is parallel to a polishing surface, enlarged by X-ray CT.
Figure 3:
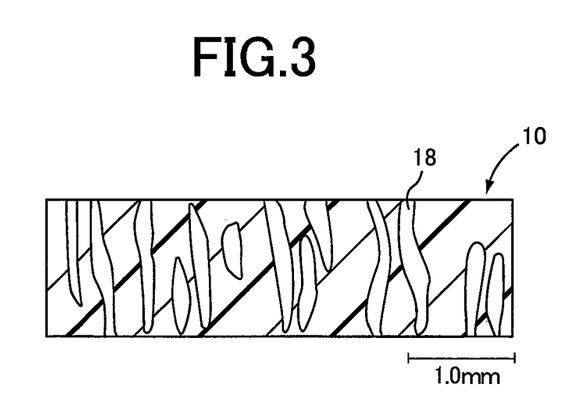
FIG. 3 is a view showing a portion of a cross section of the abrasive body of FIG. 1 in the thickness direction enlarged by X-ray CT.

FIG. 2 is a view showing a portion E of a cross section of the abrasive body 10 of this example parallel to a polishing surface 10a, i.e., surrounded by a dashed-dotted line in FIG. 1, enlarged by X-ray CT (SMX-160LT manufactured by Shimadzu Corporation). FIG. 3 is a view showing a portion of a cross section of the abrasive body 10 in a thickness direction enlarged by X-ray CT. As shown in FIGS. 2 and 3, longitudinal pores 18 are dispersedly formed on the surfaces and inside of the abrasive body 10. The longitudinal pores 18 are formed such that a length in the thickness direction is longer than a length in a planar direction. Specifically, the longitudinal pores 18 are formed such that the length of the pores 18 in the thickness direction of the abrasive body 10, i.e., a depth of the longitudinal pores 18, is larger than the length of the pores 18 in the planar direction of the abrasive body 10, i.e., a maximum diameter (opening diameter) D of the longitudinal pores 18. The longitudinal pores 18 have variations in the length in the thickness direction and the length in the planar direction. For example, the longitudinal pores 18 include pores penetrating the abrasive body 10 and opened on both the polishing surface 10a and the surface opposite to the polishing surface 10a and non-penetrating pores having no opening on either the polishing surface 10a or the surface opposite to the polishing surface 10a, or on both surfaces. In a case where a workpiece having a large polishing area is polished, since the longitudinal pores 18 are formed, for example, the absorption of the abrasive body 10 to the workpiece is suppressed so that a processing resistance (sliding resistance) due to a negative pressure generated between the abrasive body 10 and the workpiece is reduced during polishing.

In the openings formed on the polishing surface 10a side of the longitudinal pores 18, a lid-shaped structure not shown may be formed due to surface finishing, for example, buffing of the polishing surface 10a of the abrasive body 10, so that a portion of the resin structure 12 is extended to cover the opening. The lid-shaped structure is formed to entirely or partially cover the opening of the longitudinal pore 18 in the polishing surface 10a and to cover, for example, approximately 300 (μm) in the thickness direction of the opening of the longitudinal pore 18 and may drop off during use. The lid-shaped structure is not porous and is formed in a densified manner, and during the polishing, the lid-shaped structure is not absorbed to the workpiece and therefore does not act as a sliding resistance. Thus, in this example, when the longitudinal pore 18 has an opening entirely or partially covered with the lid-shaped structure, the longitudinal pore 18 is regarded as being opened. The opening of the longitudinal pore 18 covered with the lid-shaped structure has the opening diameter D defined as a circle-equivalent diameter of the opening of the longitudinal pore 18 emerging if the lid-shaped structure is removed.

Figure 4:
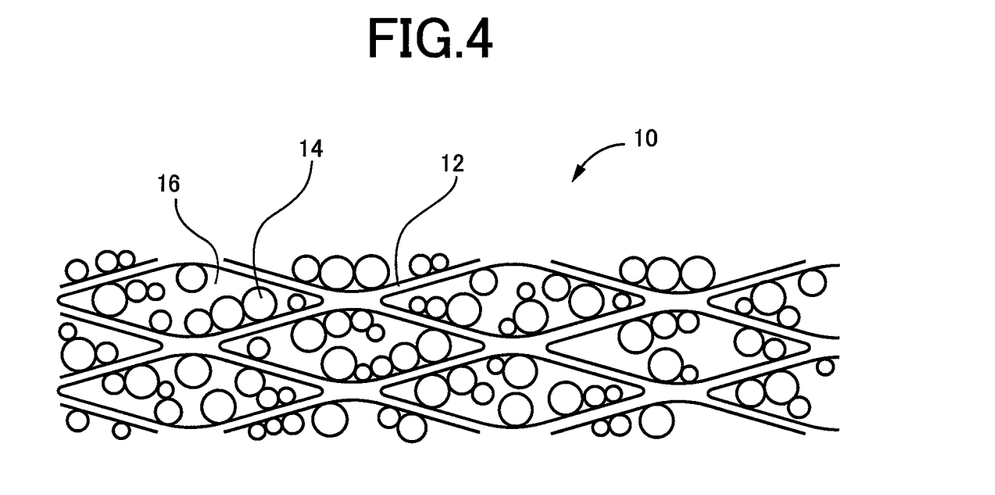
FIG. 4 is an enlarged view schematically showing a configuration of the abrasive body of FIG. 1.

FIG. 4 is a view schematically showing a configuration of the abrasive body 10 of this example. As shown in FIG. 4, the resin structure 12 has a fibriform construction in which the average sectional diameter of the fibers is, for example, approximately 0.05 (μm), and the abrasive grains 14 having the average diameter of, for example, approximately 0.3 (μm) are present in gaps between the fibers of the resin structure 12 such that some abrasive grains are affixed to an outer surface of the resin structure 12 while the other grains are located apart from the resin structure 12 in the gaps. Assuming that the gaps between the fibers of the resin structure 12 are communicating pores 16, it can be said that the abrasive grains 14 are disposed in the communicating pores 16. The communicating pore 16 may communicate with the longitudinal pores 18 and communicate with other pore(s) 16. Therefore, the abrasive grains 14 are present such that some abrasive grains are affixed to an internal wall of the communicating pore 16 or located apart from the resin structure 12 in the communicating pore 16, and each of the communicating pores 16 is formed in the resin structure 12 with at least one of the abrasive grains 14 contained therein. Thus, the abrasive grains 14 are likely to release from the resin structure 12 in the abrasive body 10 in the polishing described below in the present example and the abrasive body 10 preferably supplies free abrasive grains, namely, released abrasive grains between the abrasive body 10 and the workpiece because the abrasive grains 14 are bonded to the resin structure 12 by a necessary and sufficient bonding strength. Although the conventional polishing in the CMP method requires a supply of slurry including such as colloidal silica, the polishing in the CMP method using the abrasive body 10 in the present example requires no slurry but the polishing liquid without free abrasive grains.

Figure 5:
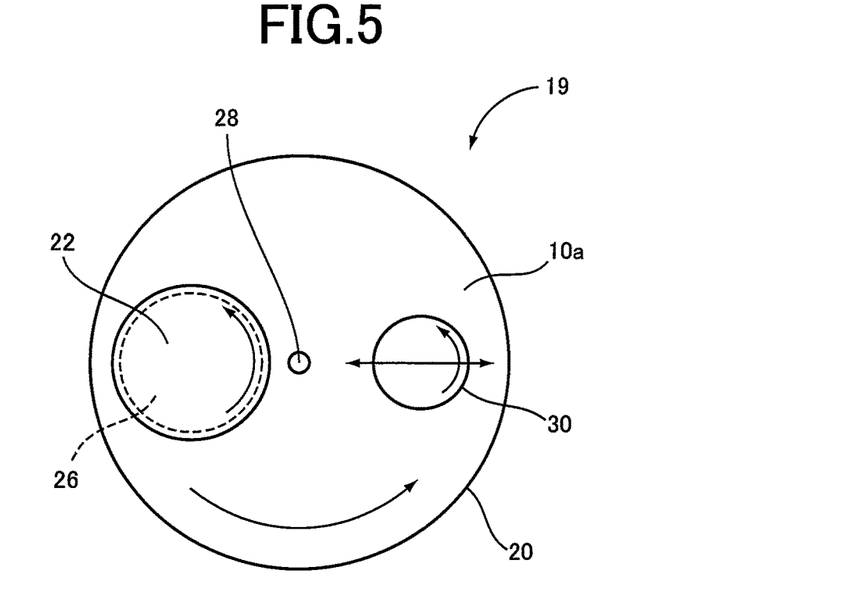
FIG. 5 is a schematic diagram showing a configuration of main portions of a polishing apparatus in the CMP method using the abrasive body of FIG. 1 and is a plan view as seen from an axial direction of a polishing table.
Figure 6:
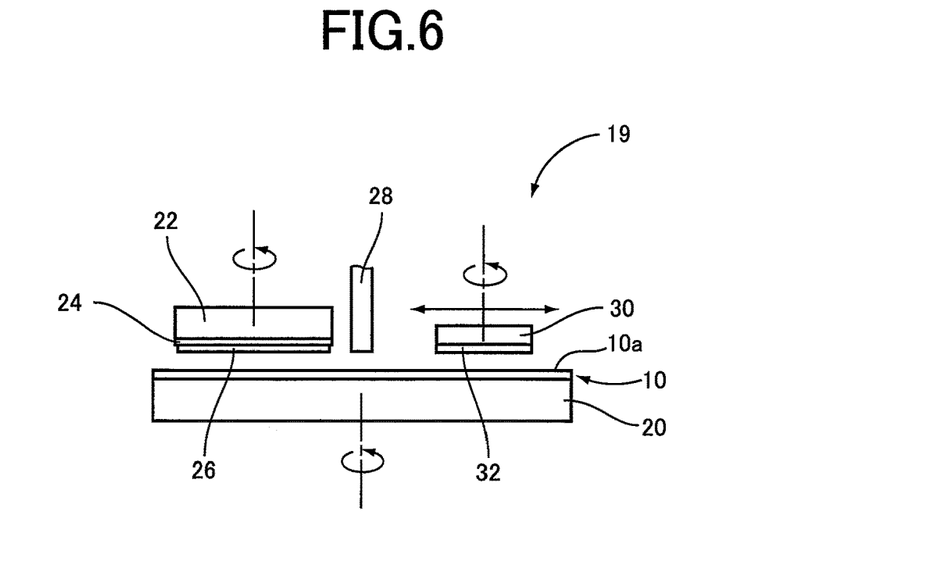
FIG. 6 is a front view of the polishing apparatus.

FIGS. 5 and 6 are schematic diagrams showing a configuration of main portions of the polishing apparatus 19 in the CMP method using the abrasive body 10 of this example. FIG. 5 illustrates the polishing apparatus 19 in a plan view as seen from an axial direction of the polishing table 20 and FIG. 6 illustrates the same in a front view. As shown in FIGS. 5 and 6, the polishing apparatus 19 is provided with the polishing table 20 supported as pivotally rotatable about its axis and the polishing table 20 is rotated in the arrowed direction of FIG. 5 by a polishing table driving motor (not shown). On an upper surface of the polishing table 20, that is, a surface on which a workpiece is pressed, the abrasive body 10 is affixed. Above and near the polishing table 20, a workpiece holder 22 to hold the workpiece is supported rotatably about its axis and movably in the axial direction. The workpiece holder 22 is rotatable in the arrowed direction in FIG. 5 by a workpiece driving motor (not shown) and absorbedly holds a semiconductor wafer 26 as the workpiece on the lower and opposite surface to the abrasive body 10 through an absorption layer 24. Near the workpiece holder 22, a polishing liquid supply nozzle 28 is provided for supplying the polishing liquid of alkaline or acid solution from a tank (not shown) in polishing.

In polishing by the CMP method, the polishing table 20 and the affixed abrasive body 10 to the table 20, and the workpiece holder 22 and the semiconductor wafer 26 absorbedly held by the holder 22 are rotated about each axis by the polishing table driving motor or workpiece driving motor, and being supplied with a polishing liquid such as amine solution through the polishing liquid supply nozzle 28 to the surface of the abrasive body 10, the semiconductor wafer 26 absorbedly held by the holder 22 is pressed. Thus, the polished and opposite surface to the abrasive body 10 of the semiconductor wafer 26 is polished with the polishing liquid (the chemical polishing) and the abrasive grains 14 (the mechanical polishing) supplied by the abrasive body 10 to be even.

As shown in FIGS. 5 and 6, the polishing apparatus 19 is provided with an adjusting tool holder 30 which is pivotally rotatable about an axis parallel to the axis of the polishing table 20 and movable in the axial direction and the radial direction of the polishing table 20, and an abrasive body adjusting tool 32 which is held on the lower and opposite surface to the abrasive body 10. The adjusting tool holder 30 and the abrasive body adjusting tool 32 held by the holder 30 are pressed on the abrasive body 10 with being rotated by an adjusting tool driving motor (not shown) and reciprocated in the radial direction of the polishing table 20, as occasion demands, to adjust the surface of the abrasive body 10 for polishing.

Figure 7:
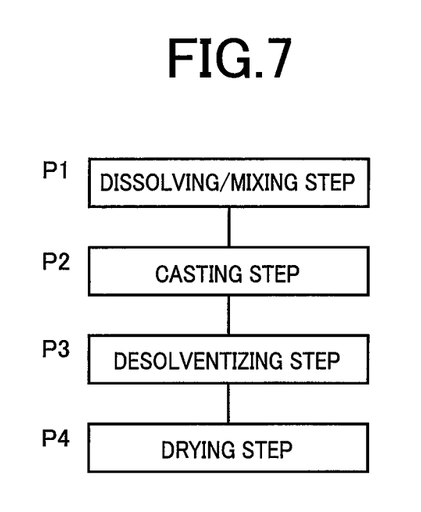
FIG. 7 is a flowchart of an example for explaining a method of manufacturing the abrasive body shown in FIG. 1.

FIG. 7 illustrates a method of manufacturing the abrasive body 10 in a diagram. Hereinafter, there will be described a method of manufacturing an abrasive body by reference to the drawing. First, in a dissolving/mixing step P1, the abrasive grains 14 are dispersed in a solvent SLV, the resin for the resin structure 12 is added to the solvent SLV in which the abrasive grains 14 are dispersed, and the resin for the resin structure 12 is dissolved. Specifically, for example, the abrasive grains 14, the resin structure 12, and the solvent SLV are put into an agitator and mixed and agitated while being heated at approximately 40 to 60 (° C.) to prepare a flow material. The solvent SLV may be any solvent dissolving the resin structure 12 and, for example, N-methylpyrrolidone, N,N-dimethylformamide, N,N-dimethylacetamide, and/or dimethylsulfoxide are/is used. A volume ratio of the resin for the resin structure 12 and the solvent SLV is preferably approximately 1:2 to 1:6. The solvent SLV increases formability of the abrasive body 10 in a casting step P2 described later and forms the communicating pores 16 in the resin structure 12 in a desolventizing step P3, and the quantity of the solvent SLV in the dissolving/mixing step P1 is reflected on a volume proportion of the communicating pores 16 in the manufactured abrasive body 10. With the range of the volume ratio of the resin for the resin structure 12 and the solvent SLV described above, the communicating pores 16 have a volume proportion of approximately 30 to 40(%) in the manufactured abrasive body 10. In the dissolving/mixing step P1, a mixing ratio of the resin for the resin structure 12, the abrasive grains 14, and the solvent SLV is reflected on a state of formation of the longitudinal pores 18 and, for example, the longitudinal pores 18 are preferably formed by mixing the resin for the resin structure 12, the abrasive grains 14, and the solvent SLV to make the viscosity higher as compared to the suede-based abrasive body.

In the subsequent casting step P2, the flow material prepared in the dissolving/mixing step P1 is scraped through a doctor blade to have a predetermined thickness or extruded from an elongated flat nozzle of a T-die (flat nozzle type) to have a predetermined thickness and is thereby cast into a sheet shape on a steel flat belt, a flat aluminum alloy casting plate, a flat glass plate, or a flat resin sheet moved relative to the doctor blade or the T-die. The predetermined thickness is set such that a target thickness of the abrasive body 10 is achieved in consideration of shrinkage due to drying etc. of the cast body having a sheet shape (hereinafter referred to as a sheet-shaped cast body), for example.

Subsequently, in the desolventizing step P3, the sheet-shaped cast body cast in the casting step P2 is immersed in a nonsolvent, for example, water, to replace the solvent SLV in the inside and surface of the sheet-shaped cast body with water to remove the solvent SLV until the resin structure 12 is cured. The nonsolvent may not be water and may be ethanol, for example. By immersing the sheet-shaped cast body in water, the solvent SLV is replaced with water so that holes are formed in the places of replacement with water, and as the resin structure 12 shrinks and cures, the holes are torn and expanded to form the longitudinal pores 18. Additionally, while the longitudinal pores 18 are formed since the resin structure 12 shrinks and cures, the communicating pores 16 are formed in the resin structure 12. The desolventizing step P3 is performed at normal temperature and normal pressure, for example. The normal pressure is a pressure without pressurization or depressurization and is approximately 1 (atm), for example.

In a drying step P4, for example, the sheet-shaped cast body having undergone the desolventizing step P3 is alternately stacked with water absorbing sheets and allowed to stand in the atmosphere at normal temperature for about 14 days to remove moisture from the sheet-shaped cast body for drying, and the abrasive body 10 of this example having the structure shown in FIGS. 2 to 4 is consequently manufactured.

Figure 8:
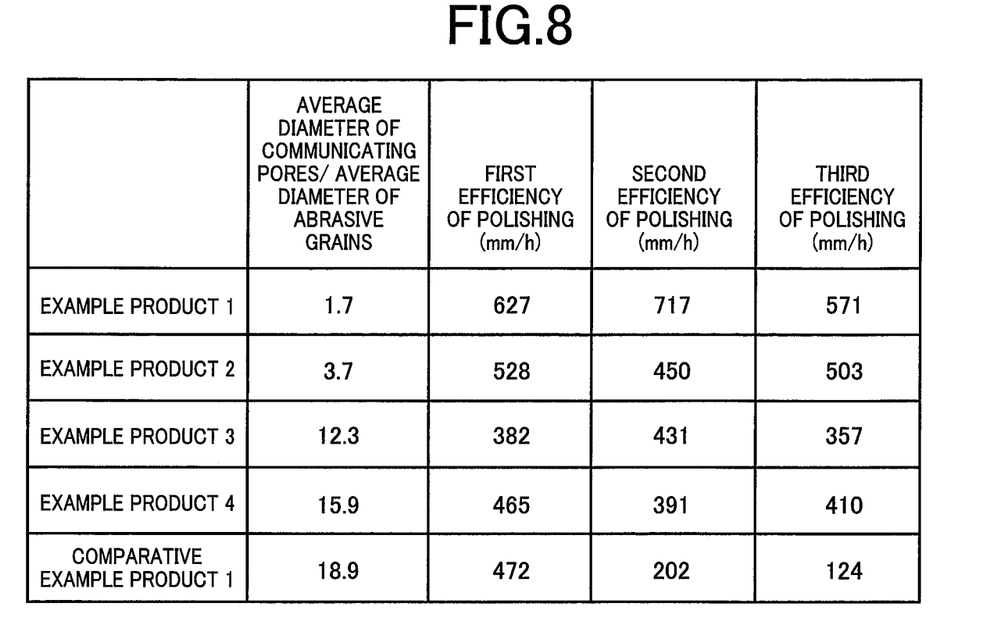
FIG. 8 is a diagram showing a test result representative of efficiency of polishing when a ratio of an average diameter of pores and an average diameter of abrasive grains is changed in a test conducted by the present inventor to verify an effect of the abrasive body shown in FIG. 4.

Verification Experiment 1 conducted by the present inventor to verify the effect of the abrasive body 10 will be described based on Example Products 1 to 4 and Comparative Example Product 1 shown in FIG. 8. FIG. 8 shows a relationship between an efficiency of polishing and a ratio of an average diameter of the communicating pores 16 and the average diameter of the abrasive grains 14. In Verification Experiment 1, the abrasive body 10 was manufactured by using polyethersulfone for the resin for the resin structure 12, silica having an average diameter of 0.3 (μm) for the abrasive grains 14, and N-methyl-2-pyrrolidone for the solvent SLV.

For example, a flow material for Example Product 1 in Verification Experiment 1 was prepared in the dissolving/mixing step P1 by mixing 26 (weight %) of the resin for the resin structure 12, 40 (weight %) of the abrasive grains 14, and 34 (weight %) of the solvent SLV. In the casting step P2, the flow material of 2 (mm) in thickness was applied and cast onto a glass plate by using a doctor blade to form a sheet-shaped cast body. This sheet-shaped cast body was subjected to the desolventizing step P3 using water as the nonsolvent and the drying step P4 to manufacture the abrasive body 10. Surface finishing was performed on a surface of the manufactured abrasive body 10 not in contact with the glass plate by buffing until a coated abrasive is applied to the entire abrasive body.

The average diameter of the pores shown in FIG. 8 was calculated by using an abrasive body cross-sectional sample obtained by ultrasonic cleaning after freezing fracture of the abrasive body 10 manufactured in the manufacturing steps. Specifically, the abrasive body cross-sectional sample was observed with FE-SEM (S-4700 manufactured by Hitachi High-Technologies Corporation), and circle-equivalent diameters of the communicating pores 16 of the abrasive body 10 were measured from an obtained image to calculate an average diameter thereof. The efficiency of polishing shown in FIG. 8 was calculated from a weight difference of a workpiece before and after a polishing test using single-side polishing of the buffed surface of the abrasive body 10.

The abrasive body 10 of Example Product 2 in Verification Experiment 1 was manufactured by performing the manufacturing method to the casting step P2 as in Example Product 1, allowing the formed sheet-shaped cast body to stand for 15 minutes in a space with a relative humidity of 60(%), and then performing the desolventizing step P3 and the drying step P4 as in Example Product 1.

The abrasive body 10 of Example Product 3 in Verification Experiment 1 was manufactured by performing the manufacturing method to the casting step P2 as in Example Product 1, allowing the formed sheet-shaped cast body to stand for 30 minutes in the space with a relative humidity of 60(%), and then performing the desolventizing step P3 and the drying step P4 as in Example Product 1.

The abrasive body 10 of Example Product 4 in Verification Experiment 1 was manufactured by performing the manufacturing method to the casting step P2 as in Example Product 1, allowing the formed sheet-shaped cast body to stand for 45 minutes in the space with a relative humidity of 60(%), and then performing the desolventizing step P3 and the drying step P4 as in Example Product 1.

The abrasive body 10 of Comparative Example Product 1 in Verification Experiment 1 was manufactured by performing the manufacturing method to the casting step P2 as in Example Product 1, allowing the formed sheet-shaped cast body to stand for 60 minutes in the space with a relative humidity of 60(%), and then performing the desolventizing step P3 and the drying step P4 as in Example Product 1.

The polishing tests of Example Products 1 to 4 and Comparative Example Product 1 in Verification Experiment 1 were performed by a polishing apparatus (Engis EJW-380), and the abrasive body 10 of 300 (mm) in diameter without a groove pattern was used. For the workpiece, one 2-inch SiC substrate with an off-angle of 4° was used. Polishing liquid was a 0.1 (mol/L) KMn04 aqueous solution and supplied at 10 (ml) per minute. Polishing was performed at pressure on surface in polishing of 51 (kPa), rotation of table (polishing table) of 60 (rpm), and a processing time of 30 (min). The polishing test was performed three times for each of Example Products 1 to 4 and Comparative Example Product 1, and the efficiency of polishing was calculated each time.

As shown in FIG. 8, the sheet-shaped cast body was allowed to stand for a longer time in the space with a relative humidity of 60(%) to form the abrasive body 10 having a larger ratio of the average diameter of the communicating pores 16 and the average diameter of the abrasive grains 14. Specifically, Example Product 1 using the abrasive body 10 manufactured without allowing the sheet-shaped cast body to stand in the space with a relative humidity of 60(%) has the average diameter of the communicating pores 16 that is 1.7 times larger than the average diameter of the abrasive grains 14, and Example Product 2 using the abrasive body 10 manufactured by allowing the sheet-shaped cast body to stand for 15 minutes in the space with a relative humidity of 60(%) has the average diameter of the communicating pores 16 that is 3.7 times larger than the average diameter of the abrasive grains 14. As the time for allowing the sheet-shaped cast body to stand in the space with a relative humidity of 60(%) is longer, the ratio of the average diameter of the communicating pores 16 and the average diameter of the abrasive grains 14 becomes larger, and Comparative Example Product 1 using the sheet-shaped cast body allowed to stand for 60 minutes in the space with a relative humidity of 60(%) has the average diameter of the communicating pores 16 that is 18.9 times larger than the average diameter of the abrasive grains 14, showing the largest ratio. As shown in FIG. 8, regarding all the efficiencies of polishing in the first, second, and third polishing tests, it is understood that Example Products 1 to 4 using the abrasive body 10 with the average diameter of the communicating pores 16 not more than 18 times larger than the average diameter of the abrasive grains 14 are superior in the efficiency of polishing to Comparative Example Product 1 using the abrasive body 10 with the average diameter of the communicating pores 16 more than 18 times larger than the average diameter of the abrasive grains 14. Furthermore, as compared to Comparative Example Product 1 having the efficiency of polishing in the second and third polishing tests significantly lower than the efficiency of polishing in the first polishing test, Example Products 1 to 4 have no significant decrease in the efficiency of polishing, and it is understood that a stable efficiency of polishing is achieved.

Figure 9:
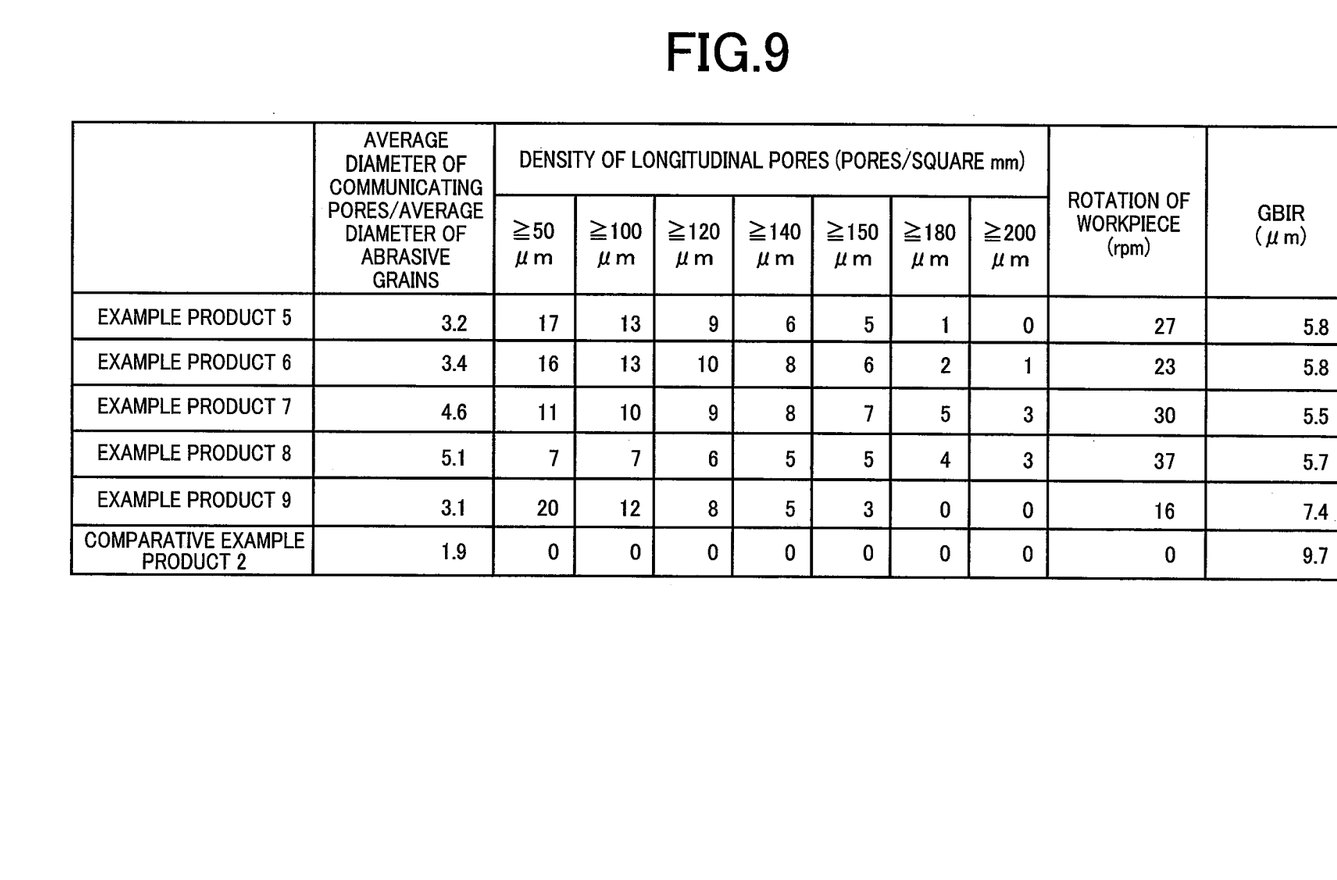
FIG. 9 is a diagram showing a test result representative of a relationship between the number of longitudinal pores per unit area and uniformity of polishing in a test conducted by the present inventor to verify an effect of the abrasive body shown in FIG. 4.

Verification Experiment 2 conducted by the present inventor to verify the effect of the abrasive body 10 will be described based on Example Products 5 to 9 and Comparative Example Product 2 shown in FIG. 9. FIG. 9 shows the relationship among the Example Products 5 to 9 and Comparative Example Product 2 regarding the ratio of the average diameter of the communicating pores 16 and the average diameter of the abrasive grains 14, the density of the longitudinal pores 18, and GBIR, i.e., a difference between the maximum thickness and the minimum thickness of a workpiece. In Verification Experiment 2, as in Verification Experiment 1, the abrasive body 10 was manufactured by using polyethersulfone for the resin for the resin structure 12, silica having an average diameter of 0.3 (μm) for the abrasive grains 14, and N-methylpyrrolidone for the solvent SLV.

For example, a flow material for Example Product 5 in Verification Experiment 2 was prepared in the dissolving/mixing step P1 by mixing 25 (weight %) of the resin for the resin structure 12, 37 (weight %) of the abrasive grains 14, and 38 (weight %) of the solvent SLV. In the casting step P2, the flow material of 2 (mm) in thickness was applied and cast onto a glass plate by using a doctor blade to form a sheet-shaped cast body. This sheet-shaped cast body was subjected to the desolventizing step P3 using water as the nonsolvent and the drying step P4 to manufacture the abrasive body 10. Surface finishing was performed on a surface of the manufactured abrasive body 10 not in contact with the glass plate by buffing until a coated abrasive is applied to the entire abrasive body. Furthermore, surface finishing of the abrasive body 10 was additionally performed to remove 0.3 (mm) of the entire surface not in contact with the glass plate.

The average diameter of the pores shown in FIG. 9 was calculated as in Verification Experiment 1 by using an abrasive body cross-sectional sample obtained by ultrasonic cleaning after freezing fracture of the abrasive body 10 manufactured in the manufacturing steps. Specifically, the abrasive body cross-sectional sample was observed with FE-SEM (S-4700 manufactured by Hitachi High-Technologies Corporation), and circle-equivalent diameters of the communicating pores 16 of the abrasive body 10 were measured from an obtained image to calculate an average diameter thereof. The average diameter and the number of the longitudinal pores 18 shown in FIG. 9 were analyzed from an image obtained by acquiring an internal structure data from an abrasive body surface by using X-ray CT (SMX-160LT manufactured by Shimadzu Corporation). In Verification Experiment 2, the workpiece driving motor for rotationally driving the workpiece holder 22 and the adjusting tool driving motor for rotationally driving the abrasive body adjusting tool 32 were not used in the polishing apparatus 19 shown in FIGS. 5 and 6. In Verification Experiment 2, the workpiece holder 22 and the abrasive body adjusting tool 32 are rotationally driven by dragging caused by the rotation of the polishing table 20 to which the abrasive body 10 is affixed. Therefore, the rotation of workpiece shown in FIG. 9 indicates a rotation speed of a workpiece caused to rotate due to the rotation of the table (polishing table 20) of the polishing apparatus 19 in FIG. 6 in the polishing test. The GBIR of the workpiece in the polishing test was measured by a flatness tester (FT-900 manufactured by Nidec Corporation).

For the abrasive body 10 of Example Product 6 in Verification Experiment 2, the dissolving/mixing step P1 to the drying step P4 in the manufacturing steps were performed as in Example Product 5, and the surface finishing was performed on the surface of the abrasive body 10 not in contact with the glass plate by buffing until a coated abrasive is applied to the entire abrasive body. Furthermore, the surface finishing of the abrasive body 10 was additionally performed to remove 0.4 (mm) on the entire surface not in contact with the glass plate.

For the abrasive body 10 of Example Product 7 in Verification Experiment 2, the dissolving/mixing step P1 to the drying step P4 in the manufacturing steps were performed as in Example Product 5, and the surface finishing was performed on the surface of the abrasive body 10 in contact with the glass plate by buffing until a coated abrasive is applied to the entire abrasive body. Furthermore, the surface finishing of the abrasive body 10 was additionally performed to remove 0.5 (mm) on the entire surface in contact with the glass plate.

For the abrasive body 10 of Example Product 8 in Verification Experiment 2, the dissolving/mixing step P1 to the drying step P4 in the manufacturing steps were performed as in Example Product 5, and the surface finishing was performed on the surface of the abrasive body 10 in contact with the glass plate by buffing until a coated abrasive is applied to the entire abrasive body.

For the abrasive body 10 of Example Product 9 in Verification Experiment 2, the dissolving/mixing step P1 to the drying step P4 in the manufacturing steps were performed as in Example Product 5, and the surface finishing was performed on the surface of the abrasive body 10 not in contact with the glass plate by buffing until a coated abrasive is applied to the entire abrasive body. Furthermore, the surface finishing of the abrasive body 10 was additionally performed to remove 0.2 (mm) on the entire surface not in contact with the glass plate.

For the abrasive body 10 of Comparative Example Product 2 in Verification Experiment 2, the dissolving/mixing step P1 to the drying step P4 in the manufacturing steps were performed as in Example Product 1 in Verification Experiment 1, and the surface finishing was performed on the surface of the abrasive body 10 not in contact with the glass plate by buffing until a coated abrasive is applied to the entire abrasive body. Furthermore, the surface finishing of the abrasive body 10 was additionally performed to remove 0.2 (mm) on the entire surface not in contact with the glass plate.

The polishing tests of Example Products 5 to 9 and Comparative Example Product 2 in Verification Experiment 2 were performed by a polishing apparatus (SpeedFam 32 SPAW), using the abrasive body 10 of 812 (mm) in diameter with concentric grooves of 1 (mm) in width at pitches of 5 (mm). For the workpiece, three 4-inch SiC substrates with an off-angle of 4° were used. Polishing liquid was a 0.25 (mol/L) KMn04 aqueous solution and supplied at 5 (ml) per minute. Polishing was performed at pressure on surface in polishing of 43 (kPa), rotation of table (polishing table) of 35 (rpm), and a processing time of 120 (min).

In FIG. 9, for example, in the abrasive body 10 of Example Product 5 in Verification Experiment 2, it is shown that the average diameter of the communicating pores 16 is 3.2 times larger than the average diameter of the abrasive grains 14, and the 17 longitudinal pores 18 per square mm have the opening diameter D of 50 (μm) or more. It is also shown that among the 17 longitudinal pores 18 per square mm having the opening diameter D of 50 (μm) or more formed in the abrasive body 10 of Example Product 5, the 13 longitudinal pores 18 per square mm have the opening diameter D of 100 (μm) or more. It is further shown that among the 13 longitudinal pores 18 per square mm having the opening diameter D of 100 (μm) or more formed in the abrasive body 10 of Example Product 5, the 9 longitudinal pores 18 per square mm have the opening diameter D of 120 (μm) or more, that among the 9 longitudinal pores 18 per square mm having the opening diameter D of 120 (μm) or more, the 6 longitudinal pores 18 per square mm have the opening diameter D of 140 (μm) or more, that among the 6 longitudinal pores 18 per square mm having the opening diameter D of 140 (μm) or more, the 5 longitudinal pores 18 per square mm have the opening diameter D of 150 (μm) or more, that among the 5 longitudinal pores 18 per square mm having the opening diameter D of 150 (μm) or more, the one longitudinal pore 18 per square mm has the opening diameter D of 180 (μm) or more, and that none of the longitudinal pores 18 has the opening diameter D of 200 (μm) or more. It is shown that the abrasive body 10 of Example product 5 had the rotation of workpiece of 27 (rpm) and the GBIR of 5.8 (μm) in the polishing test.

As shown in FIG. 9, as compared to Comparative Example Product 2 without the longitudinal pores 18 of 50 (μμm) or more in the opening diameter D, Example Products 5 to 9 provided with the longitudinal pores 18 of 50 (μm) or more in the opening diameter D have the GBIR of 8 (μm) or less, so that the workpiece is uniformly polished. As shown in FIG. 9, it is preferable that the seven or more longitudinal pores 18 having the opening diameter D of 50 (μm) or more are formed per square mm. Additionally, as compared to Example Product 9 and Comparative Example Product 2 without the longitudinal pores 18 of 180 (μm) or more in the opening diameter D, Example Products 5 to 8 provided with the longitudinal pores 18 of 180 (μm) or more in the opening diameter D are superior in the GBIR, so that the workpiece is more uniformly polished. As shown in FIG. 9, it is preferable that the one or more longitudinal pores 18 having the opening diameter D of 180 (μm) or more are formed per square mm. Furthermore, as shown in FIG. 9, as compared to Comparative Example Product 2 without the longitudinal pores 18 of 50 (μm) or more in the opening diameter D, Example Products 5 to 9 provided with the longitudinal pores 18 of 50 (μm) or more in the opening diameter D make the rotation of workpiece larger, and as compared to Example Product 9 and Comparative Example Product 2 without the longitudinal pores 18 of 180 (μm) or more in the opening diameter D, Example Products 5 to 8 provided with the longitudinal pores 18 of 180 (μm) or more in the opening diameter D make the rotation of workpiece larger. Therefore, during the polishing in which a workpiece is pressed against the abrasive body 10 for polishing, the abrasive body 10 provided with the longitudinal pores 18 of 50 (μm) or more in the opening diameter D makes the negative pressure generated between the abrasive body 10 and the workpiece smaller due to the longitudinal pores 18 so that the sliding resistance is reduced, and therefore, the workpiece can smoothly be rotated and uniformly be polished.

As described above, according to this example, the abrasive body 10 is provided with the resin structure 12, the plurality of the abrasive grains 14, and the plurality of the longitudinal pores 18 and made in a form of disk; the resin structure 12 includes the communicating pores 16 communicating with the longitudinal pores 18 and/or communicating with each other; the communicating pores 16 include at least one of the abrasive grains 14; and the average diameter of the communicating pores 16 is not more than 18 times larger than the average diameter of the abrasive grains 14. Therefore, during the polishing in which a workpiece is pressed against the abrasive body 10 for the polishing, the abrasive body 10 can stably retain the abrasive grains 14 in the communicating pores 16 without excessively releasing the abrasive grains 14 contained in the communicating pores 16 and therefore can achieve stable polishing performance. Additionally, the abrasive body 10 is provided with the longitudinal pores 18 and therefore can reduce the sliding resistance due to the negative pressure generated between the abrasive body 10 and the workpiece during the polishing, so that the workpiece can uniformly be polished.

According to this example, each of the longitudinal pores 18 has opening on the polishing surface 10a side of the abrasive body 10. As a result, the sliding resistance due to the negative pressure generated between the abrasive body 10 and the workpiece can further be reduced, so that the workpiece can more uniformly be polished.

According to this example, each of the openings of the longitudinal pores 18 is formed such that the opening diameter D of the longitudinal pores 18 is not less than 50 (μm). As a result, the sliding resistance due to the negative pressure generated between the abrasive body 10 and the workpiece can further be reduced, so that the workpiece can more uniformly be polished.

According to this example, the abrasive body 10 is provided with the seven or more longitudinal pores 18 of 50 (μm) or more in the opening diameter D per square millimeter on the polishing surface 10a. As a result, the sliding resistance due to the negative pressure generated between the abrasive body 10 and the workpiece can further be reduced, so that the workpiece can more uniformly be polished.

According to this example, the abrasive body 10 is formed such that the dimension of the opening diameter of the longitudinal pore 18 is 180 (μm) or more. As a result, the sliding resistance due to the negative pressure generated between the abrasive body 10 and the workpiece can further be reduced, so that the workpiece can more uniformly be polished.

According to this example, the abrasive body 10 is provided with the one or more longitudinal pores 18 of 180 (μm) or more in the opening diameter D per square millimeter on the polishing surface 10a. As a result, the sliding resistance due to the negative pressure generated between the abrasive body 10 and the workpiece can further be reduced, so that the workpiece can more uniformly be polished.

According to this example, the resin structure 12 contains a polysulfone-based resin. As a result, the practical abrasive body 10 can be provided by using the resin structure 12 excellent in material strength, for example.

According to this example, the average diameter of the abrasive grains 14 ranges from 0.005 (μm) to 3.0 (μm). As a result, polishing scratches can be prevented from occurring on the workpiece due to the abrasive grains 14 released from the resin structure 12 when polishing to the workpiece is performed, so that the polishing can be performed with high accuracy.

According to this example, the abrasive grains 14 contain silica. As a result, the practical abrasive body 10 can be provided by using the abrasive grains suitable for a workpiece.

According to this example, the abrasive body 10 is provided by the manufacturing method including the dissolving/mixing step P1 of dissolving the resin for the resin structure 12 in the solvent SLV mixed with the abrasive grains 14 to prepare a flow material, the casting step P2 of casting the flow material into a sheet shape having a predetermined thickness, the desolventizing step P3 of immersing the sheet-shaped cast body cast in the casting step P2 in a nonsolvent to remove the solvent SLV from the sheet-shaped cast body until the resin structure 12 is cured, and the drying step P4 of drying the sheet-shaped cast body having subjected to the desolventizing step P3. During the polishing in which the workpiece is pressed against the abrasive body 10 for polishing, the abrasive body 10 manufactured in this way can stably retain the abrasive grains 14 in the communicating pores 16 without excessively releasing the abrasive grains 14 contained in the communicating pores 16. Additionally, the abrasive body 10 is provided with the longitudinal pores 18 and therefore can reduce the sliding resistance due to the negative pressure generated between the abrasive body 10 and the workpiece. Therefore, since the abrasive grains 14 can stably be retained in the communicating pores 16, stable polishing performance can be achieved, and the sliding resistance between the abrasive body 10 and the workpiece can be reduced, so that the abrasive body 10 capable of uniformly polishing the workpiece can be manufactured.

While the invention has been described in its exemplary example, the invention may be otherwise embodied.

For instance, although the resin structure 12 has a fibriform construction in the above example, it is preferable example and not limited to the fibriform construction. The resin structure 12 in the abrasive body 10 according to the present invention may have communicating pores 16 in the bubble form, which the pores are communicated one another. Such a resin structure as free abrasive grains are supplied not from the outside but by the resin structure itself in polishing by the CMP method may be adopted.

In the example described above, the abrasive grains 14 are dispersed in the solvent SLV, and the resin for the resin structure 12 is added to the solvent SLV in which the abrasive grains 14 are dispersed so that the resin for the resin structure 12 is dissolved in the solvent SLV, in the dissolving/mixing step P1; however, the present invention is not necessarily limited thereto, and the resin for the resin structure 12 may be dissolved in the solvent SLV before the abrasive grains 14 are mixed and agitated, or the resin for the resin structure 12, the solvent SLV, and the abrasive grains 14 may be put into an agitator substantially at the same time before mixing and agitation. Alternatively, the resin for the resin structure 12 dissolved in a portion of the solvent SLV and the abrasive grains 14 dispersed in the remaining solvent SLV may be put into an agitator before mixing and agitation.

In the example described above, N-methylpyrrolidone is used as the solvent SLV; however, the present invention is not necessarily limited thereto, and the solvent SLV may be any solvent suitably dissolving the resin for the resin structure 12 in the dissolving/mixing step P1, forming the communicating pores 16 communicating with the longitudinal pores 18 and communicating with other pores 16 as well as the longitudinal pores 18 in the casting step P2 and the desolventizing step P3, and suitably volatilizing in the drying step P4.

While the acid solution without free abrasive grains and others are used as a polishing liquid for polishing by the CMP method with the abrasive grains 10 in the example, the slurry may be used. In that case, the slurry with a few abrasive grains is expected to allow polishing which is sufficient in efficiency of polishing and polishing performance, or superior in efficiency of polishing and polishing performance to the conventional polishing pad and slurry. The abrasive body according to the present invention may be employed for polishing with neutral liquid such as pure water and for a variety of polishings.

While the abrasive body 10 is used for polishing of one entire surface of the semiconductor wafer 26 such as a SiC bare wafer in the example, the abrasive body 10 according to the present invention may be used for polishing of an outer circumferential end surface (outer circumferential surface) of the semiconductor wafer 26, a back surface of a patterned semiconductor wafer, and a glass substrate for electronic devices, for example. Specifically, the abrasive body 10 may be used for any workpieces on condition that the present invention is effective.

The above description is merely an embodiment, and the present invention can be implemented in variously modified and improved forms based on the knowledge of those skilled in the art without departing from the spirit thereof although not exemplarily illustrated one by one.

REFERENCE SIGNS LIST

10: abrasive body 12: resin structure 14: abrasive grain 16: communicating pore 18: longitudinal pore P1: dissolving/mixing step P2: casting step P3: desolventizing step P4: drying step

What is claimed is:

1. An abrasive body used for polishing by a CMP method, comprising a resin structure, a plurality of abrasive grains, and a plurality of longitudinal pores, and made in a form of disc, wherein
    each longitudinal pore of the plurality of longitudinal pores has a length in a thickness direction of the abrasive body longer than a length in a planar direction of the abrasive body, wherein
    the resin structure includes communicating pores each of which communicating with the longitudinal pore and/or communicating with other communicating pore, wherein
    the communicating pores include at least one of the abrasive grains in the communicating pores respectively,
    the average diameter of the communicating pores is within a range between 1.7 times and 15.9 times of the average diameter of the abrasive grains, an opening diameter of the longitudinal pore is equal to or larger than 50 µm, and seven or more of the longitudinal pores are provided per square mm on a polishing surface of the abrasive body.

2. The abrasive body according to claim 1, wherein the longitudinal pore has the opening diameter of 180 (µm) or more.

3. The abrasive body according to claim 2, wherein the abrasive body is comprising the one or more longitudinal pores of 180 (µm) or more in the opening diameter D per square millimeter on the polishing surface.

4. The abrasive body according to claim 1, wherein the resin structure contains a polysulfone-based resin.

5. The abrasive body according to claim 1, wherein the average diameter of the abrasive grains ranges from 0.005 (µm) to 3.0 (µm).

6. The abrasive body according to claim 1, wherein the abrasive grains contain silica.

7. The abrasive body according to claim 1, wherein the plurality of longitudinal pores comprises a longitudinal pore having a length larger than 1.0 mm in the thickness direction.

8. A method of manufacturing the abrasive body according to claim 1, comprising:

dissolving a resin for the resin structure in a solvent mixed with the abrasive grains to prepare a flow material;

casting the flow material into a sheet shape having a predetermined thickness to form a sheet-shaped cast body;

immersing the sheet-shaped cast body in a nonsolvent to remove the solvent from the sheet-shaped cast body until the resin structure is cured; and after the resin structure is cured, drying the sheet-shaped cast body.

* * * * *